United States Patent

Biggadike

(10) Patent No.: US 8,461,825 B2
(45) Date of Patent: Jun. 11, 2013

(54) CURRENT MEASUREMENT APPARATUS WITH SHUNT RESISTOR AND HEAT SINK

(75) Inventor: Christopher Stephen Andrew Biggadike, Cheltenham (GB)

(73) Assignee: Ultra Electronics Limited, Greenford, Middlesex (GB)

( * ) Notice: Subject to any disclaimer, the term of this patent is extended or adjusted under 35 U.S.C. 154(b) by 462 days.

(21) Appl. No.: 12/934,476

(22) PCT Filed: Mar. 26, 2009

(86) PCT No.: PCT/GB2009/000816
§ 371 (c)(1),
(2), (4) Date: Sep. 24, 2010

(87) PCT Pub. No.: WO2009/118533
PCT Pub. Date: Oct. 1, 2009

(65) Prior Publication Data
US 2011/0006754 A1   Jan. 13, 2011

(30) Foreign Application Priority Data
Mar. 27, 2008  (GB) .................................. 0805585.7

(51) Int. Cl.
*G01R 1/20*   (2006.01)
(52) U.S. Cl.
USPC ........... 324/126; 324/426; 324/434; 320/150; 338/49; 361/103; 361/106
(58) Field of Classification Search
CPC .. G01R 1/203; G01R 19/0092; G01R 19/0015; G01R 15/146; G01R 15/183; G01R 19/0084; G01R 19/16542; G01R 19/16547; G01R 19/20; G01R 19/2513; G01R 22/065; G01R 22/066; G01R 27/28; G01R 31/006
USPC ................. 324/117 H, 117 R, 126, 127, 414, 324/426, 434, 511, 713, 750.3, 754.07, 762.01, 324/762.09, 76.11; 361/103, 106; 320/104, 320/105, 107, 111, 113, 115, 150; 338/49
See application file for complete search history.

(56) References Cited

U.S. PATENT DOCUMENTS

| 5,083,081 A | 1/1992 | Barrault et al. |
| 6,489,693 B1 | 12/2002 | Hetzler |

(Continued)

FOREIGN PATENT DOCUMENTS

| DE | 101 18 027 | 11/2002 |
| DE | 102 11 117 | 9/2003 |

(Continued)

*Primary Examiner* — Hezron E Williams
*Assistant Examiner* — Hoang Nguyen
(74) *Attorney, Agent, or Firm* — Merchant & Gould P.C.

(57) ABSTRACT

A current measurement apparatus includes a shunt resistor (1) located between two terminal members (5, 6), each connected electrically to a respective end (4, 3) of the shunt resistor, and each extending over substantially the whole of an adjacent side face of the shunt resistor. Electrically insulating, thermally conductive material (8, 9) is provided between each side face of the shunt resistor (1) and the terminal members (5, 6), and serves to provide a thermal path for heat exchange between the shunt resistor and the terminals. The shunt resistor (1) is engineered to have the desired electrical properties, and the terminal members are connected by mechanical fasteners (13, 14) to ensure the required electrical properties without calibration. Measuring circuitry (15) is incorporated between the shunt resistor (1) and terminal members (5, 6). The invention is implemented as a compact assembly encased in an outer insulated housing (18, 19) and is conveniently connectable to a battery terminal, to monitor current flow.

13 Claims, 3 Drawing Sheets

U.S. PATENT DOCUMENTS

| | | | |
|---|---|---|---|
| 6,787,935 B2 * | 9/2004 | Heim | 307/10.1 |
| 6,794,854 B2 * | 9/2004 | Nakatsu et al. | 322/27 |
| 7,088,217 B2 | 8/2006 | Enomoto et al. | |
| 7,135,891 B2 | 11/2006 | Grasso et al. | |
| 7,292,022 B2 * | 11/2007 | Hirasawa | 324/126 |
| 7,500,888 B2 * | 3/2009 | Roset et al. | 439/754 |
| 7,688,022 B2 * | 3/2010 | Alvarez-Troncoso et al. | 320/104 |
| 2003/0020592 A1 | 1/2003 | Hirasawa | |
| 2003/0057770 A1 | 3/2003 | Heim | |
| 2003/0075732 A1 | 4/2003 | Franke et al. | |
| 2005/0024806 A1 | 2/2005 | Hirasawa | |
| 2008/0030208 A1 | 2/2008 | Aratani | |

FOREIGN PATENT DOCUMENTS

| | | |
|---|---|---|
| EP | 1 030 185 | 8/2000 |
| FR | 2 877 732 | 5/2006 |
| JP | 2002-319501 | 10/2002 |
| JP | 2003-203805 | 7/2003 |
| JP | 2003-235268 | 8/2003 |
| WO | WO 01/44825 | 6/2001 |
| WO | WO 2006/051190 | 5/2006 |

* cited by examiner

CURRENT MEASUREMENT APPARATUS WITH SHUNT RESISTOR AND HEAT SINK

This application is a National Stage Application of PCT/GB2009/000816, filed 26 Mar. 2009, which claims benefit of Serial No. 0805585.7, filed 27 Mar. 2008 in Great Britain and which applications are incorporated herein by reference. To the extent appropriate, a claim of priority is made to each of the above disclosed applications.

TECHNICAL FIELD

This invention relates to current measurement apparatus incorporating a shunt resistor.

Current measurement apparatus is known that makes use of a shunt resistor through which the current flows and across which a voltage measurement is made. The current is derived from the measured voltage using Ohm's Law. The effectiveness of this apparatus depends upon manufacturing a shunt with known electrical properties. Typically, the shunt is composed of material with a low temperature/resistance coefficient, such as Manganin (Registered Trade Mark), to counter the effect of temperature variations on measurements. The Manganin shunt has copper terminals soldered to each end to accommodate connection in the measurement circuit. Because of the soldered terminals, the electrical properties of the shunt vary from one shunt to the next in the production process, and therefore it needs to be calibrated before it can be used, which involves modifying the cross-section of the Manganin material, for example, by grinding.

DISCLOSURE OF THE INVENTION

According to the invention, current measurement apparatus comprises a shunt resistor located between two terminal members, each connected electrically to a respective end of the shunt resistor, and each extending over substantially the whole of an adjacent side face of the shunt resistor in thermal contact therewith but electrically insulated therefrom.

Preferably electrically insulating material is provided between each side face of the shunt resistor and the terminal members in close contact therewith to provide a thermal path for heat exchange between the shunt resistor and the terminals. The two terminal members therefore function as heat sinks to control the temperature of the shunt resistor.

The shunt resistor is preferably engineered to have the desired electrical properties, and the terminal members are connected by mechanical fasteners to the ends of the shunt resistor so as to ensure that the resulting assembly has the required electrical properties without needing calibration.

The electrically insulating material may comprise a thermal interface material such as Berquist "Sil-Pad"™ or Fujipoly "SARCON"™.

Preferably, measuring circuitry is incorporated between the shunt resistor and terminal members, and preferably takes the form of a circuit board. Connection of the measuring circuitry to the shunt resistor and terminal members is therefore facilitated. Furthermore, the measuring circuitry may incorporate a temperature sensor to monitor temperature of the shunt resistor and to allow compensation for variation of resistance with temperature.

The invention can be readily implemented as a compact assembly encased in an outer insulated housing, and is conveniently connectable to an electrical terminal, such as a battery terminal, to monitor current flow.

DESCRIPTION OF THE DRAWINGS

The invention will now be described by way of example with reference to the accompanying drawings in which.

EMBODIMENTS OF THE INVENTION

Figure 1:
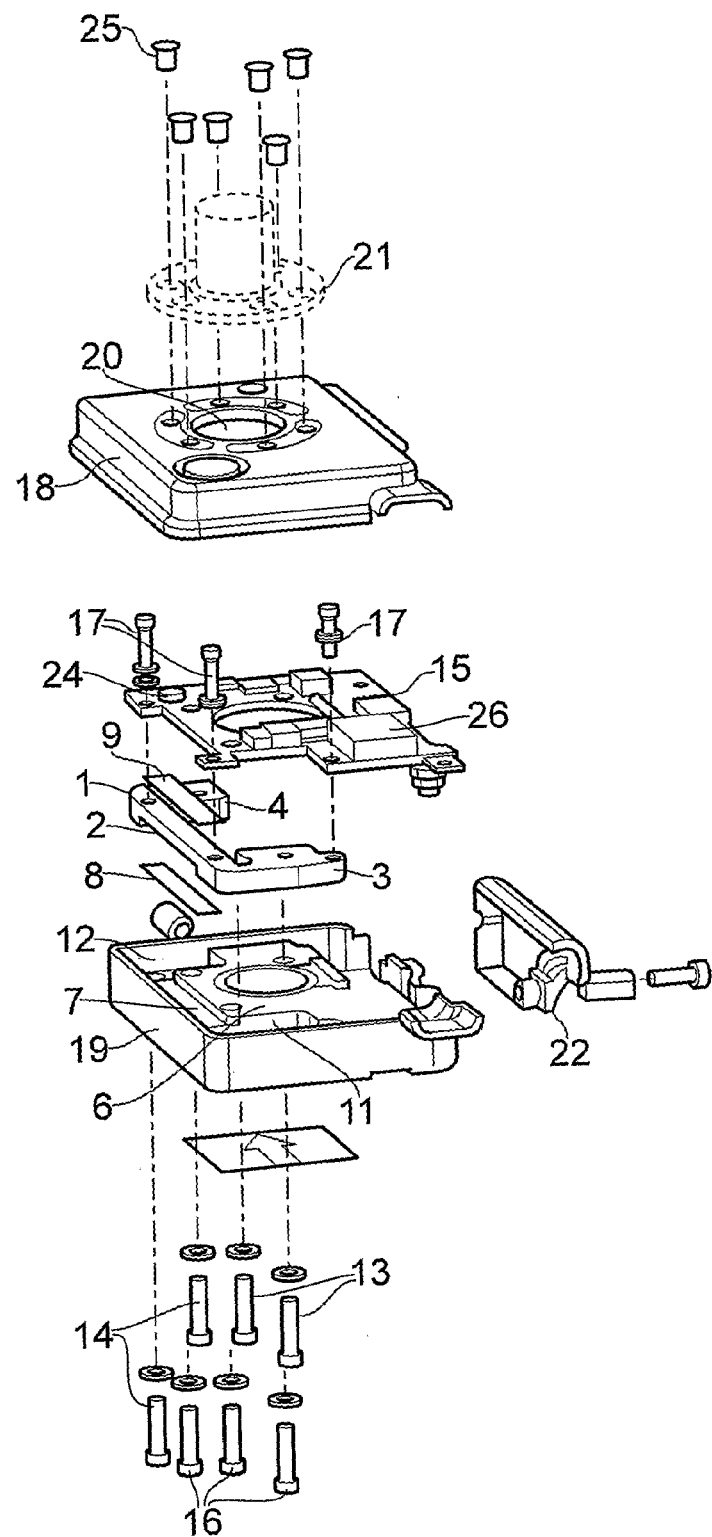
FIG. 1 discloses an exploded assembly of current measuring apparatus according to the invention.

The apparatus illustrated in the drawings comprises a shunt resistor 1 composed of brass in a "C" shape with an intermediate portion 2 and laterally extending end portions 3, 4 at each end. The intermediate portion 2 is substantially rectilinear and has a reduced thickness compared with the end portions 3, 4.

Figure 2:
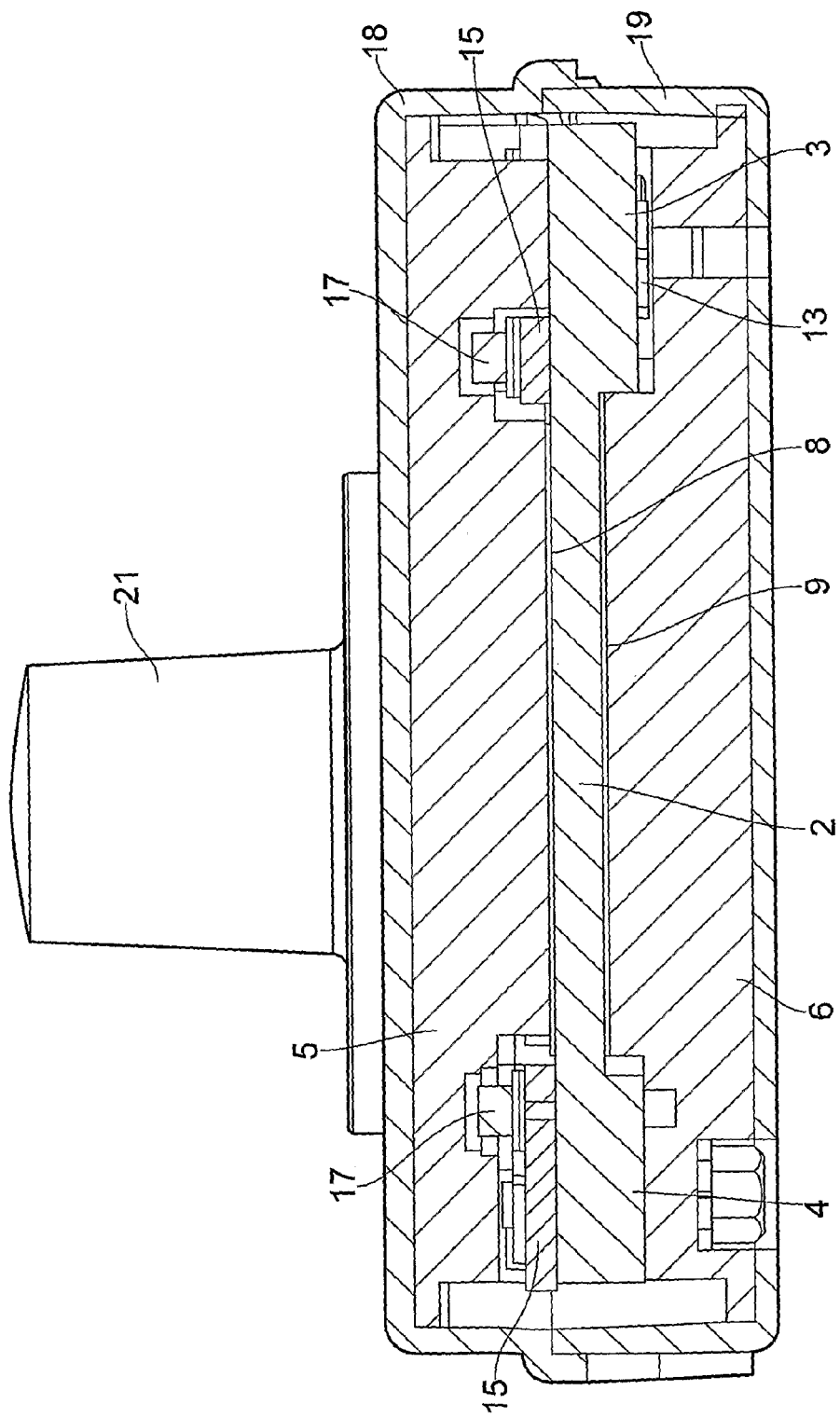
FIG. 2 discloses a cross-section through the assembled components of FIG. 1.

The shunt resistor 1 is sandwiched between a pair of terminal members 5, 6 which form a close fit above and below the shunt resistor as shown in FIG. 2. The terminal members 5, 6 extend to overlie the whole of the shunt resistor and form a channel 7 between them to receive the intermediate portion 2 of the shunt resistor. Thermally conductive, electrically insulating layers 8, 9 are located both sides of the intermediate portion 2 so as to insulate it from those portions of the terminal members 5, 6 immediately above and below it whilst allowing good thermal transfer. The end portions 3, 4 of the shunt resistor are also received in recesses 11, 12 formed between the terminal members 5, 6, and one end portion 3 is secured by screw fasteners 13 to the upper terminal member 5 and the other end portion 4 is secured by screw fasteners 14 to the lower terminal member 6. These fasteners 13, 14 ensure an electrical connection between the end portions of the shunt resistor and the respective terminal members 5, 6. Clearances ensure that electrical connection to the terminal members is limited to these connections. Further screw fasteners 16 serve to mechanically connect the two terminal members 5, 6 together.

In addition, an electrical circuit board 15 is incorporated in the assembly between the two terminal members 5, 6 and is secured by fasteners 17 to the shunt resistor 1. The circuit board 15 carries electrical components 26 which form measuring circuitry to derive the current flowing in the intermediate portion 2 of the shunt resistor from the voltage across it as tapped at measuring points at each end where the fasteners 17 connect the circuit board 15 to the shunt resistor. The measuring circuitry also incorporates a temperature sensor 24 in the form of a thermistor located adjacent the intermediate portion 2 so as to be responsive to its temperature and to provide a current measurement correction dependent upon the temperature of the intermediate portion. Under low current conditions, the temperature of the shunt will be substantially the same as the temperature of the battery terminal 30, but they may differ under higher current conditions, and the thermistor may be repositioned on the board 15 to favour sensing one of the other. The measuring circuitry may comprise known circuitry designed for this purpose.

The assembly of the shunt resistor 1, circuit board 15 and terminal members 5, 6 is encased in an insulating housing formed by upper and lower housing members 18, 19 which are secured together as shown in FIG. 2. A central aperture 20 is formed through the housing members, upper and lower terminal members and the circuit board so as to accommodate a post terminal 30 of a battery 31, as shown schematically in FIG. 3. An output terminal in the form of a post terminal 21 is connected to the upper surface of the upper housing member 18 in alignment with the aperture 20 and is electrically connected to the upper terminal member 5 by fasteners 25.

In use, the assembly is connected to the negative post terminal 30 of a battery 31 with the post terminal 30 engaging the aperture 20 in electrical contact with the lower terminal member 6. Current is drawn from the battery via a load connection 32 to the post terminal 21, and this current flows through the shunt resistor 1. The measuring circuitry then measures the voltage across the intermediate portion 2, of known resistance, and from this derives the current flow.

Figure 3:
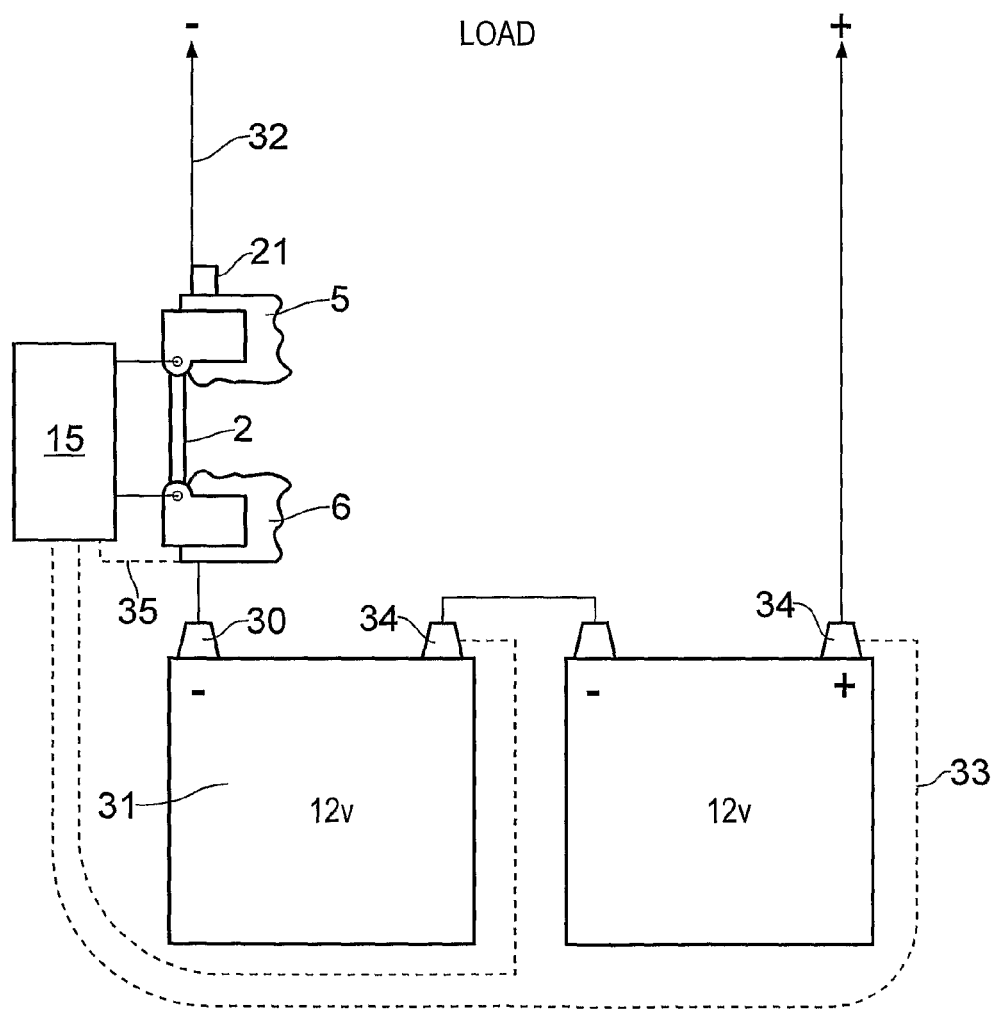
FIG. 3 is a schematic drawing of the apparatus of FIGS. 1 and 2 in use.

The measuring circuitry may also incorporate circuitry to monitor the capacitance of a battery by analysing electrical pulses that it applies across the battery terminals. A conductor 33 applies the electrical pulses to the positive battery terminal 34. A cable clamp 22 secures the conductor 33 to the assembly. The apparatus may be used to measure the capacitance of individual battery cells connected in series, a conductor 33 being connected to the positive terminal 34 of each cell, as shown in FIG. 3. The measuring circuitry may also measure the core temperature of the battery using a thermistor 24.

It will be appreciated that apparatus according to the invention is of simple construction and that the components can be manufactured from readily available materials relying upon manufacturing accuracy to ensure accurate measurements without requiring calibration of the apparatus. In particular, the shunt member can be made of any engineering material with consistent electrical properties, although ferrous materials would not be suitable if battery capacitance measurements are also to be made by the measuring circuitry. The layers 8, 9 may be composed of thermal interface materials such as Berquist "Sil-Pad"™ or Fujipoly "Sarcon"™ or any similar material having the necessary electrically insulating and thereby conductive properties.

The apparatus can be arranged so that the current measurements are fully temperature compensated. The arrangement of the terminal members makes use of these as heat sinks. The whole assembly is extremely compact and can be manufactured as a module that can be readily installed to monitor battery performance.

The invention claimed is:

1. Current measuring apparatus comprising two terminal members and a shunt resistor located between the two terminal members, each terminal member being connected electrically to a respective end of the shunt resistor, wherein the shunt resistor comprises an intermediate portion and end portions by which the shunt resistor is connected to the terminal members, and wherein electrically insulating, thermally conducting material is provided between the intermediate portion and the terminal members so that each terminal member is in thermal contact therewith but electrically insulated therefrom, wherein the shunt resistor is sandwiched between the terminal members and each terminal member overlies substantially the whole of an adjacent side face of the intermediate portion of the shunt resistor.

2. Apparatus as claimed in claim 1, wherein the end portions extend laterally of the intermediate portion to one side thereof.

3. Apparatus as claimed in claim 2, wherein the intermediate portion has a reduced thickness compared with the end portions.

4. Apparatus as claimed in claim 3, wherein the intermediate portion has a rectilinear shape.

5. Apparatus as claimed in claim 1, wherein the shunt resistor is composed of brass.

6. Apparatus as claimed in claim 1, furthering comprising measuring circuitry electrically connected to the shunt resistor to monitor the current flow through the shunt resistor when in use.

7. Apparatus as claimed in claim 6, wherein the shunt resistor, terminal members and measuring circuitry are incorporated in a module.

8. Apparatus as claimed in claim 6, wherein the measuring circuitry comprises a circuit board on which the measuring circuitry is mounted and which is located between the two terminal members.

9. Apparatus as claimed in claim 6, wherein the measuring circuitry includes a temperature sensor to monitor the temperature of the shunt resistor, and temperature compensating circuitry to adjust the measured current in accordance with variations in the temperature of the shunt resistor.

10. Apparatus as claimed in claim 6, wherein the measuring circuitry incorporates circuitry to measure the capacitance of a battery and is adapted to be connected via conductors to one or more battery terminals.

11. Apparatus as claimed in claim 1, wherein the shunt resistor and terminal members are incorporated in a module with an aperture formed in the module to receive a battery terminal post with the terminal post in electrical contact with one of the terminal members.

12. Apparatus as claimed in claim 11, further comprising an electrical output terminal which is connected electrically to the other of the terminal members.

13. Apparatus as claimed in claim 1, wherein the shunt resistor and terminal members are housed in an electrically insulating housing.

\* \* \* \* \*